United States Patent [19]

Nakajima et al.

[11] Patent Number: 5,306,473
[45] Date of Patent: Apr. 26, 1994

[54] QUARTZ GLASS CRUCIBLE FOR PULLING A SINGLE CRYSTAL

[75] Inventors: Toshio Nakajima; Yuji Hayashi; Satoru Tachibana; Kazuhiko Takariki, all of Oguni, Japan

[73] Assignee: Toshiba Ceramics Co., Ltd., Tokyo, Japan

[21] Appl. No.: 828,737

[22] Filed: Jan. 31, 1992

[51] Int. Cl.$^5$ .............................................. B01D 9/00
[52] U.S. Cl. .................. 422/248; 156/617.1; 156/DIG. 83
[58] Field of Search ............... 156/617.1, 618.1, 620.4, 156/DIG. 83; 422/248

[56] References Cited

U.S. PATENT DOCUMENTS

| | | | |
|---|---|---|---|
| 4,416,680 | 11/1983 | Brüning et al. | 65/144 |
| 4,528,163 | 7/1985 | Albrecht | 422/249 |
| 4,632,686 | 12/1986 | Brown et al. | 65/18.1 |
| 4,956,208 | 9/1990 | Uchikawa et al. | 428/34.6 |

Primary Examiner—Olik Chaudhuri
Assistant Examiner—Felisa Garrett
Attorney, Agent, or Firm—Foley & Lardner

[57] ABSTRACT

A quartz glass crucible for pulling a single crystal, which comprises a cylindrical straight portion, a bottom portion and a curved intermediate portion for connecting the straight portion and the bottom portion. The straight portion has an opaque area positioned within about 75% or less of the total height of the crucible, measured from the upper open end of the crucible. The opaque area in the straight portion has a total bubble volume which ranges from about $7 \times 10^{-3}$ cm$^3$/cm$^3$ to $30 \times 10^{-3}$ cm$^3$/cm$^3$. The remaining straight portion, the curved intermediate portion and the bottom portion consist of two layers. One layer is an inner transparent layer having a total volume of bubbles of about $4 \times 10^{-3}$ cm$^3$/cm$^3$ or less and corresponds to from about 20% to 60% of the thickness of the crucible, measured from the inside surface thereof. The other layer is an outer opaque layer having a total volume of bubbles ranging between about $7 \times 10^{-3}$ cm$^3$/cm$^3$ and $30 \times 10^{-3}$ cm$^3$/cm$^3$, which is integral with the opaque area of the upper part of the straight portion.

8 Claims, 2 Drawing Sheets

QUARTZ GLASS CRUCIBLE FOR PULLING A SINGLE CRYSTAL

BACKGROUND OF THE INVENTION

1. Field of the Invention

This invention relates to a quartz glass crucible for pulling a semiconductor single crystal such as silicon.

More specifically, the present invention relates to a quartz glass crucible having two layers in its structure, which can decrease defects in pulled silicon single crystals. In the single crystal pulling process, such crucibles are used as a container for melted semiconductor materials.

2. Description of Related Art

Conventionally, in producing a single crystal such as a single crystal silicon semiconductor material, the so-called "Czochralski" method has been widely adopted. According to that method, polycrystalline silicon is melted in a vessel, and a seed crystal is dipped at its tip end portion into the melt. Then the seed is pulled while it is being rotated so that a single crystal is grown on the seed with the same crystallographic orientation. A vessel adapted for the pulling of a single crystal is made in the form of a quartz crucible. Quartz crucibles are classified in accordance with their external appearance, which is determined by the differences in the production methods. There are two basic categories, namely, transparent crucibles having a relatively low bubble content, and opaque crucibles having a high content of minute bubbles to provide an opaque appearance. The latter crucible will hereinafter be referred to as the "opaque crucible".

The opaque crucible is produced by a process in which powders of quartz are introduced into a mold and accumulated to form a layer along the inner surface of the mold. The layer of quartz powder is then heated at the inner surface thereof while the mold is rotated, to produce a crucible of a glass having a relatively high bubble content. The opaque quartz crucible is advantageous in that it has a higher strength when compared with a transparent crucible, and it is relatively easy to form a crucible of a large size. Further, minute bubbles contained in the opaque crucible contribute to uniformize the thermal distribution. For the reasons stated above, the opaque crucible has been widely used in practice.

In the above-described conventional quartz glass crucible, which consists of a totally opaque body, the bubbles in the crucible body increase in volume during the step of pulling the single crystal under a reduced pressure at a high temperature. Consequently, the specific gravity of the crucible changes, and the crucible is deformed so as to change the liquid level of the melt in the crucible. Sometimes, the bubbles in the crucible body are ruptured, with the result that the glass layer of the crucible positioned above the liquid level peels and the peeled particles fall into the melt in the crucible. As a result, the contact area between the crucible and the melt is increased, causing the concentration of dissolved oxygen to increase. Accordingly, the pull yield is decreased, and then the quality of the semiconductor wafers is decreased.

U.S. Pat. No. 4,956,208 teaches the formation of a substantially bubble-free inner layer on an outer substrate layer, by forming an atmosphere of high temperature gas and supplying a metered quantity of quartz powders to the high temperature gas atmosphere. It is intended to have the quartz powders be at least partly molten and directed toward an inner surface of the substrate layer so as to be adhered thereon.

U.S. Pat. No. 4,528,163 teaches the formation of a crucible substrate with an outer layer made of powders of natural quartz and an inner layer made of powders of synthetic quartz. The crucible substrate is then heated at the inner surface to form a thin smooth layer of an amorphous nature. In the specification of the '163 patent, the inner layer comprises synthetic "crystalline" quartz. The inner layer formed in accordance with the teaching of this patent should be considered to contain a noticeable quantity of bubbles or voids.

U.S. Pat. No. 4,416,680 and U.S. Pat. No. 4,632,686 teach the idea of decreasing the bubble content by applying a suction pressure to the external surface of the quartz crucible while the crucible is being heated. However, the processes taught by these patents are not particularly effective to decrease the bubble content because the bubbles are subjected to a substantial resistance in passing through the layer of quartz glass.

In the practice of pulling silicon single crystals, the quality control of the pulled single crystal, even during pulling, is significant. It is said that some microdefects, such as so-called oxidation stacking fault (OSF) or bulk micro defect (BMD), are mostly due to the thermal history of the single crystal in a high temperature area near the crucible after it was crystallized. The pulling of silicon single crystals is carried out usually with the apparatus shown in FIG. 1. With reference to FIG. 1, some upper portion of quartz crucible 21 is positioned above the carbon holder 22, in order to make it easy to handle the quartz crucible. In such a construction, if there is a transparent layer 25 which tends to transfer heat easily, the heat coming from the heater 23 which surrounds the crucible will become more than that of an opaque crucible, and the heat from the melt contained in the crucible will transfer via the transparent layer 25 and will emit from the top end of the crucible. The just-crystallized silicon crystal 27 which is being pulled receives such undesirable heat emissions. Additionally, since the heat escapes from the melt through the transparent layer to the top end of the layer, which terminates freely, control of the melt temperature becomes difficult. As a result of these problems, the OSF and BMD increase, and the yield of good single crystal is decreased.

Therefore, there is a need for providing a quartz crucible which can overcome such problems.

SUMMARY OF THE INVENTION

One object of the present invention is to provide a quartz glass crucible for pulling a single crystal in which the yield of single crystal production can be increased, whereby semiconductor devices can be produced from such a single crystal at high yield. Another object of the invention resides in the provision of a quartz glass crucible in which production reliability can be increased.

In order to achieve these and other objects of the present invention, a quartz glass crucible for pulling a single crystal is provided according to the present invention which comprises a cylindrical straight portion, a bottom portion and a curved intermediate portion for connecting the straight portion and the bottom portion. The straight portion has an opaque area positioned within 75% or less of the total height of the crucible, measured from the upper open end of the crucible. The opaque area has many bubbles in the straight portion, with the total volume of the bubbles ranging from about $7\times10^{-3}$ cm$^3$/cm$^3$ to $30\times10^{-3}$ cm$^3$/cm$^3$. The remaining straight portion, the curved intermediate portion and the bottom portion consist of two layers. One layer is an inner transparent layer having a total volume of bubbles of $4\times10^{-3}$ cm$^3$/cm$^3$ or less so as to correspond to from 20% to 60% of the thickness of the crucible, measured from the inside surface thereof. The other layer is an outer opaque layer having a total volume of bubbles ranging between about $7\times10^{-3}$ cm$^3$/cm$^3$ and $30\times10^{-3}$ cm$^3$/cm$^3$, which is integral with the straight portion consisting of the opaque layer.

According to another aspect of the present invention there has been provided a method and apparatus for pulling a semiconductor single crystal using the crucible according to the invention.

Further objects, features and advantages of the present invention will become apparent from the detailed description of preferred embodiments that follows, when considered together with the attached figures of drawing.

BRIEF DESCRIPTION OF THE DRAWINGS

This invention is described with reference to the following detailed description taken in conjunction with the drawings in which.

DETAILED DESCRIPTION OF THE PREFERRED EMBODIMENTS

Figure 1:
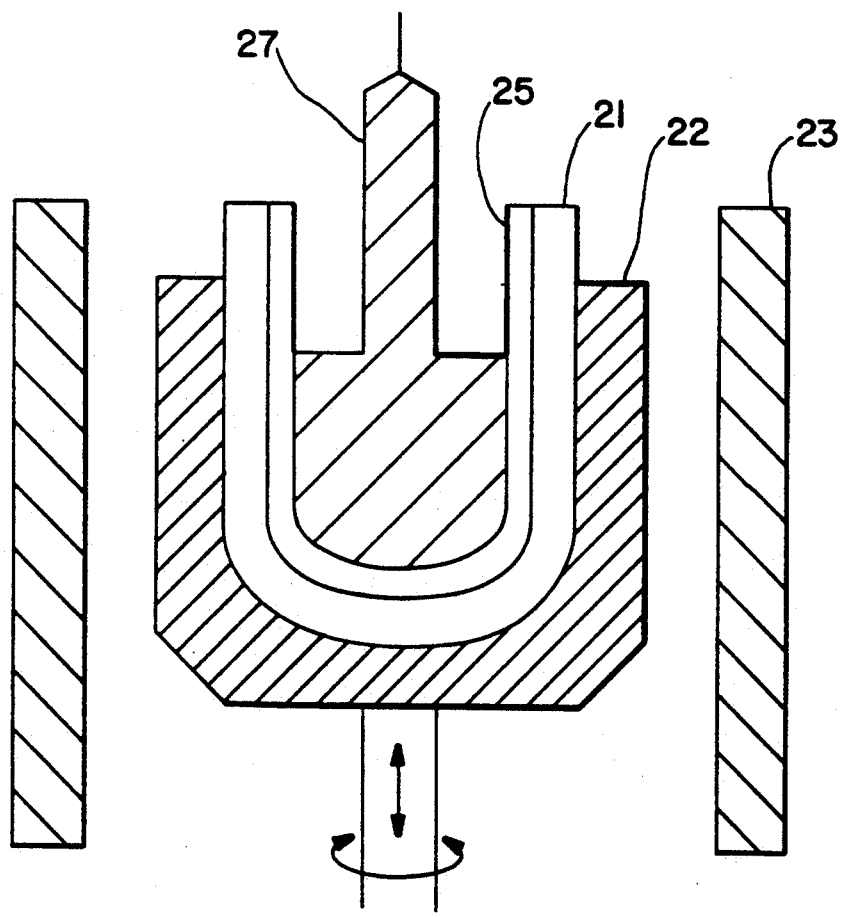
FIG. 1 is a vertical sectional view showing a part of a conventional single crystal pulling apparatus.
Figure 2:
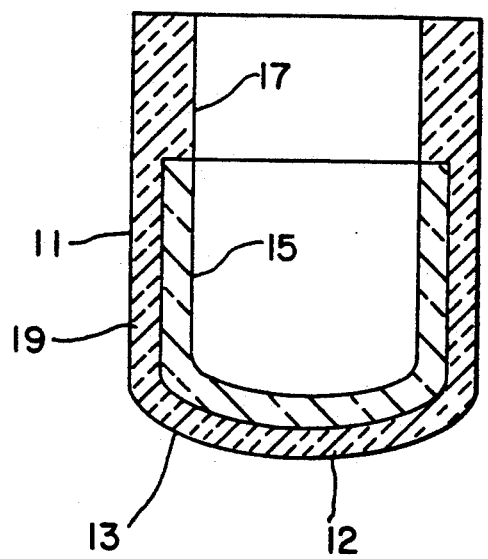
FIG. 2 is a vertical sectional view showing a quartz glass crucible for pulling a single crystal according to an embodiment of the present invention.

Preferred embodiments of quartz glass crucible in accordance with this invention will be described with reference to the drawings.

The crucible has a cylindrical straight portion 11, a bottom portion 12 slightly projecting in a lower direction with a relatively large curvature, and a curved intermediate portion 13 for connecting the straight portion 11 and the bottom portion 12.

The portion of the crucible 15 which directly contacts the melt therein, such as silicon, is transparent because it includes only a small number of bubbles. The portion of the crucible 17 which faces a single crystal ingot as it is being drawn is opaque because it includes many bubbles. The totally opaque area of the straight portion of the crucible preferably extends within 75% or less of the total height of the crucible, measured from the open end.

If the total volume of bubbles in the above-described opaque area is more than about $30\times10^{-3}$ cm$^3$/cm$^3$, the portion of the wall near the open end of the crucible is largely deformed during the single crystal pulling step, so that the pulling operation cannot be smoothly carried out. On the other hand, if the total volume of the bubbles in the totally opaque straight portion area is less than about $7\times10^{-3}$ cm$^3$/cm$^3$, the radiant heat coming directly from the carbon heater cannot be cut-off or shielded, and it will affect the single crystal ingot during the pulling step. As a consequence, temperature control becomes difficult, and the pulling operation cannot be properly carried out.

If the length of the totally opaque area of the straight portion having a total volume of bubbles of from about $7\times10^{-3}$ cm$^3$/cm$^3$ to $30\times10^{-3}$ cm$^3$/cm$^3$ is more than 75% of the total height of the crucible, the contact area between the totally opaque area and the melt (such as silicon) in the crucible increases so as to increase the bubble effects. It is preferable that the lower limit of the totally opaque area is positioned above the initial melt level or surface and is arranged over a height corresponding to about 30-50% of the total height of the crucible, measured from the upper open end thereof.

If the total volume of bubbles in the remaining straight portion, the curved intermediate portion and the bottom portion is more than about $4\times10^{-3}$ cm$^3$/cm$^3$ (i.e., in the inner layer having a thickness corresponding to 20-60% of the total thickness of the crucible measured from the inner surface thereof), the bubble expansion, the melt level change due to the bubble rupture, the falling of the glass layer or the devitrification layer into the melt all result in an increase in the dissolved oxygen concentration so that the pull yield and the quality of semiconductor wafers decrease. If the total bubble volume in the remaining outer layer is more than about $30\times10^{-3}$ cm$^3$/cm$^3$, the curved intermediate portion and the bottom portion are largely deformed due to the expanded bubbles. If the total bubble volume in the remaining layer is less than about $7\times10^{-3}$ cm$^3$/cm$^3$, the radiant heat directly coming from the carbon heater cannot be shielded and the heat radiated from the silicon melt through the transparent layer will increase. In this case, control of the thermal history of pulled ingots becomes difficult.

If the thickness from the inner surface of the remaining straight portion, the curved intermediate portion and the bottom portion (which have a total bubble volume of about $4\times10^{-3}$ cm$^3$/cm$^3$ or less) is more than about 60% of the total thickness of the crucible, the radiant heat directly coming from the carbon heater cannot be shielded, and temperature control becomes difficult. If it is less than about 20%, the effect of the expanded bubbles placed in the outer layer becomes large, and the pull yield is decreased. Also, the quality of semiconductor wafers is lowered.

Preferably, the transparent layer, i.e., the inner layer in the remaining area of the straight wall portion, the bottom wall portion and the curved intermediate wall portion, consist essentially of transparent quartz glass and having a total volume of bubbles of about $1\times10^{-3}$ cm$^3$/cm$^3$ or less.

In the region of the crucible which has two layers, an intermediate layer can exist between the inner transparent layer and outer opaque layer, in which the bubble volume is greater than that of the transparent portion and smaller than that of opaque portion. The bubble volume distribution will increase in the direction from the side near the inner layer to the side near the outer layer, if the intermediate layer is relatively thick.

EMBODIMENT 1

Quartz crystal powder having a grain size of from 30 mesh (#) to 50 mesh was arranged in a carbon mold, around a mixture of quartz crystal powder having a grain size of 200 mesh or less and quartz crystal powder having a grain size of from 80 mesh to 150 mesh in the ratio of 2:5 in a uniform and homogeneous mixed condition within a carbon mold in the shape of a crucible. Each particle of the powder contained only a small volume of bubbles. Such quartz crystal powder was fused by a conventional arc means whereby, as shown in FIG. 1, a crucible of 14 inch diameter having a height of 254 mm was produced. The carbon mold was rotated through the beginning of arranging the quartz powder to the end of the arc operation. The crucible had a cylindrical straight portion 11, a bottom portion 12 slightly projecting in a lower direction with a relatively large curvature and a curved intermediate portion 13 for connecting the straight portion 11 and the bottom portion 12. During the arc operation, the inner area 15 of the arranged quartz powder was first melted. Because the usage of fine quartz powders which can easily melt and contains less bubbles, and the centrifugal force generated by the rotation of the carbon mold, the melted qurtz pushed away the air between the particles. Therefore, the transparent layer 15 containing less bubbles was obtained.

In this crucible, the area 17 of the straight portion 11 having a length or width of 80 mm from its upper open end had a total bubble volume of from about $7 \times 10^{-3}$ $cm^3/cm^3$ to $30 \times 10^{-3}$ $cm^3/cm^3$. The remaining area of the straight portion 11, the curved intermediate portion 13 and the bottom portion 12 substantially consisted of two layers, one of which is a transparent inner layer 15 and the other of which is an opaque outer layer 19.

The transparent inner layer was formed in place of the opaque inner layer by an electric arc operation. The opaque outer layer 19 was integral with the totally opaque upper area 17 of the straight portion 11.

The inner transparent layer had an average thickness 35%, ranging from about 25% to 40% of the total thickness of the crucible from the inner surface thereof.

The inner transparent layer had a total bubble volume of $4 \times 10^{-3}$ $cm^3/cm^3$ or less. The outer opaque layer had an average bubble volume of $13^{-3}$ $cm^3/cm^3$, ranging from $7 \times 10^{-3}$ $cm^3/cm^3$ to $20 \times 10^{-3}$ $cm^3/cm^3$.

The pull yield was increased by 3% after 100 silicon single crystals were pulled with the above-described crucible, in comparison with a conventional 14 inch type crucible.

EMBODIMENT 2

By the same method as used in Embodiment 1, a crucible of 14 inch type having a total height of 254 mm was produced.

In this crucible, the area of the straight portion having a length or width of 100 mm from its upper open end had a total bubble volume of from about $7 \times 10^{-3}$ $cm^3/cm^3$ to $30 \times 10^{-3}$ $cm^3/cm^3$. The remaining area of the straight portion, the curved intermediate portion and the bottom portion substantally consisted of two layers, one of which was a transparent inner layer 15 and the other of which was an opaque outer layer 19. As in Embodiment 1, the transparent inner layer was formed in place of the opaque inner layer by an electric arc operation. The opaque outer layer 19 was integral with the totally opaque upper area 17 of the straight portion. The inner transparent layer had an average thickness of 35%, ranging from about 30% to 40% of the total thickness of the crucible from the inner surface thereof.

The pull yield was increased by 5% after 100 silicon single crystals were pulled with the above-described crucible, in comparison with a conventional 14 inch type crucible. The pull yield was increased 2% in comparison of conventional 2-layer crucible.

According to the present invention, a portion of the crucible which contacts directly the melt, such as silicon, in the crucible is transparent because it includes few bubbles therein. The portion of the crucible which faces a single crystal ingot is opaque because it includes many bubbles therein. Therefore, the disadvantageous effects of the bubbles placed in the crucible body can be eliminated. The meritorious effects of the bubbles in the crucible body can be properly utilized. As a result, the yield of pulling a single crystal can be improved in comparison with the prior art single crystal pull yield. In addition, semiconductor devices can be produced from such a single crystal at a high production yield, and the production reliability can be improved.

The foregoing description has been set forth merely to illustrate the invention and is not intended to be limiting. Since modifications of the described embodiments incorporating the spirit and substance of the invention may occur to persons skilled in the art, the scope of the invention should be construed as including all variations falling within the appended claims and equivalents.

What is claimed is:

1. A quartz glass crucible for pulling a single crystal, which comprises:
   a cylindrical straight wall portion including a first area having a height corresponding to about 75% or less of the total height of the crucible, measured from an upper open end of the crucible, the first area comprising across its entire thickness an opaque material having a total volume of bubbles ranging from about $7 \times 10^{-3}$ $cm^3/cm^3$ to $30 \times 10^{-3}/cm^3$;
   a bottom wall portion; and
   a curved intermediate wall portion connecting the straight wall portion and the bottom wall portion;
   the straight wall portion further having a second area, wherein said second area, said curved intermediate portion and said bottom portion are comprised of two layers, the first layer of which comprises an inner transparent layer having a total volume of bubbles of about $4 \times 10^{-3}$ $cm^3$ or less and corresponding to from about 20% to 60% of the total thickness of the crucible wall measured from the inside surface thereof, and the second layer of which comprises an outer layer comprised of an opaque material having a total volume of bubbles ranging between about $7 \times 10^{-3}$ $cm^3/cm^3$ and $30 \times 10^{-3}$ $cm^3/cm^3$.

2. A quartz glass crucible for pulling a single crystal as defined in claim 1, in which said second layer in the second area of the straight wall portion is integral with the first area of the straight wall portion.

3. A quartz glass crucible for pulling a semiconductor single crystal as defined claim 1, in which the first layer in the second area of the straight wall portion, the bottom wall portion and the curved intermediate wall portion consists essentially of transparent quartz glass having a total volume of bubbles of about $1 \times 10^{-3}$ $cm^3/cm^3$ or less.

4. A quartz glass crucible for pulling a semiconductor single crystal as defined in claim 1, in which the second area of the straight wall portion, the curved intermediate portion and the bottom portion further comprise a third layer disposed between the inner layer and the outer layer, the third layer having a total volume of bubbles greater than the total volume of bubbles of the inner layer and smaller than the total volume of bubbles of the outer layer.

5. An apparatus for pulling silicon single crystal comprising:
   a quartz glass crucible comprising:

a cylindrical straight wall portion including a first area having a height corresponding to about 75% or less of the total height of the crucible, measured from an upper open end of the crucible, the first area comprising across its entire thickness an opaque material having a total volume of bubbles ranging from about $7 \times 10^{-3}$ cm$^3$/cm$^3$ to $30 \times 10^{-3}$ cm$^3$/cm$^3$;

a bottom wall portion; and a curved intermediate wall portion connecting the straight wall portion and the bottom wall portion;

the straight wall portion further having a second area, wherein said second area, said curved intermediate portion and said bottom portion are comprised of two layers, the first layer of which comprises an inner transparent layer having a total volume of bubbles of about $4 \times 10^{-3}$ cm$^3$/cm$^3$ or less and corresponding to from about 20% to 60% of the total thickness of the crucible wall measured from the inside surface thereof, and the second layer of which comprises an outer layer comprised of an opaque material having a total volume of bubbles ranging between about $7 \times 10^{-3}$ cm$^3$/cm$^3$ and $30 \times 10^{-3}$ cm$^3$/cm$^3$;

a holder contacting the quartz glass crucible for holding the crucible;

a heater surrounding the quartz glass crucible and the holder; and a chamber in which the quartz glass crucible is provided, the chamber being able to provide an airtight internal space.

6. An apparatus as defined in claim 5, in which said second layer of said second area of the straight wall portion is integral with the first area of the straight wall portion 7. An apparatus as defined in claim 5, in which the second area of the straight wall portion, the bottom wall portion and the curved intermediate wall portion consist essentially of transparent quartz glass having a total volume of bubbles of about $1 \times 10^{-3}$ cm$^3$/cm$^3$ or less.

8. An apparatus as defined in claim 5, in which the second area of the straight wall portion, the curved intermediate portion and the bottom portion further comprise a third layer disposed between the inner layer and the outer layer, the third layer having a total volume of bubbles greater than the total volume of bubbles of the inner layer and smaller than the total volume of bubbles of the outer layer.

* * * * *